United States Patent
Wimberger-Friedl et al.

(10) Patent No.: US 7,108,816 B2
(45) Date of Patent: Sep. 19, 2006

(54) BARRIER AND A METHOD OF MANUFACTURE THEREOF

(75) Inventors: Reinhold Wimberger-Friedl, Eindhoven (NL); Peter Paul Koets, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 33 days.

(21) Appl. No.: 10/266,275

(22) Filed: Oct. 8, 2002

(65) Prior Publication Data

US 2004/0214031 A1    Oct. 28, 2004

(30) Foreign Application Priority Data

Oct. 12, 2001    (EP)    ................................... 01203913

(51) Int. Cl.
    *B29C 47/06*    (2006.01)
(52) U.S. Cl. ............................. 264/173.11; 264/173.12; 264/173.16; 264/211.11
(58) Field of Classification Search ........... 264/173.11, 264/173.12, 173.16, 211.11; 428/430, 431, 428/435, 436, 437, 440, 441, 442
See application file for complete search history.

(56) References Cited

U.S. PATENT DOCUMENTS 5,593,794 A * 1/1997 Wei et al. ..................... 429/91
5,607,789 A    3/1997 Treger et al. ................. 429/90

OTHER PUBLICATIONS

"Oxide glasses of very low softening point. Part 4. Preparation and properties of ultraphosphate glasses containing boric oxide"; N.H. Ray, R.J. Plaisted & W.D. Robinson; Imperial Chemical Industries Limited, Corporate Laboratory, Runcorn; Glass Technology, vol. 17, No. 2, Apr. 1976; pp. 66-71.

* cited by examiner

*Primary Examiner*—D. S. Nakarani

(57) ABSTRACT

This invention relates to a method of manufacture of a barrier, especially for electronic display devices, comprising the step of co-extruding a melt of at least one inorganic material with a melt of at least one organic material, wherein the at least one inorganic material and the at least one organic material are co-extruded as a continuous sheet.

12 Claims, 2 Drawing Sheets

BARRIER AND A METHOD OF MANUFACTURE THEREOF

The present invention relates to a method of manufacture of a barrier, especially for electronic display devices, comprising alternating layers of at least one inorganic material and at least one organic material.

Barriers are very important for electronic display devices, and especially essentially transparent barriers. The barriers protect the devices against gases, like oxygen and moisture, and should have low permeability. Up to now mainly inorganic glasses are used industrially. For many applications like in OLED's, polymer-LED's and CRT's the barrier requirement can only be met by continuous inorganic layers, and for transparent parts only inorganic glasses are used. However, more flexible displays are desirable for different applications, and for these displays glass is not applicable because of its brittleness. Organic coatings on inorganic glass sheet is one approach to overcome these problems, but these barriers suffer from crazing upon cutting the sheets, and defects or crazes may lead to short diffusion paths in the barrier films. Moreover, multilayers of organic materials do lead to an improvement as compared to single layers, due to a synergistic effect of different permeability and interfacial effects. Another route to achieve a barrier that is sufficiently flexible is to use flake-like inorganic fillers in polymer materials. This also gives a significant improvement, however, at the cost of processability, especially at high volumetric loading. However, the use of glass flakes affects the optical clarity in a negative manner. Therefore, barriers comprising inorganic barrier layers coated on polymeric substrates have been developed, and are widely used.

In U.S. Pat. No. 5,607,789 an organic electroluminescent device having a protective barrier is described in accordance with the prior art. This document discloses a double layer made of one organic barrier layer and one inorganic barrier layer on top of the organic barrier layer. The organic barrier layer is preferably formed of cured monomers or oligomers having a glass transition point. The inorganic barrier layer is preferably made of materials that are more or less stable against moisture, and are deposited by vapour phase techniques in order to form a continuous barrier layer on top of the organic barrier layer.

However, this barrier does not leave good enough barrier properties maintained when the barrier is subjected to mechanical deformations, mainly because of defects in the coating, like pin holes and crazes, which may lead to the formation of diffusion paths through the layers.

Therefore, one object of the present invention is to provide a barrier, especially for electronic display devices, overcoming the problems with the above-described prior-art.

These and other objects are achieved by a barrier comprising alternating layers of at least one organic material and at least one inorganic material, manufactured by a method comprising the step of co-extruding a melt of the at least one inorganic material with a melt of the at least one organic material, wherein the at least one inorganic material and the at least one organic material are co-extruded as a continuous sheet. The melt of the at least one inorganic material and the melt of the at least one organic material are co-extruded through a co-extrusion channel comprising at least one multiplication element, and the continuous sheet comprises at least 10 alternating layers of the inorganic and the organic materials.

The inorganic material is preferably an inorganic glass, which has a low glass-transition temperature, and the organic material is generally a polymer, which has a glass-transition temperature. The glass-transition temperatures are preferably below 300° C., more preferably in the interval 150–300° C. Moreover, the viscosities of the melts of the inorganic and organic materials are preferably adjusted to be as close as possible to equal values at a certain working temperature and deformation rate.

Suitably, in accordance with a preferred embodiment of the invention, the barrier is transparent and the refractive indices for the inorganic glass and organic polymer material are reasonably matched in order to reduce reflections at the interfaces between inorganic and organic layers.

Finally, this invention also relates to a display device comprising the barrier, as described above, wherein the barrier is preferably transparent, and comprising alternating layers of inorganic and organic materials. These and other aspects of the invention will be apparent from and elucidated with reference to the embodiment described hereinafter.

A currently preferred embodiment of the present invention will now be described in closer detail, with reference to the accompanying drawings.

The present invention relates to a barrier, which is manufactured by a simple method and the barrier is thermoformable and reshapable, and have good enough barrier properties suitable for the use as a barrier for electronic display applications. The inventive approach is based on co-extrusion of a melt of an inorganic material with a melt of an organic material. This method is simple, not time consuming, cheap and may comprise various starting materials, which could be difficult to be used, for example, in deposition techniques. The co-extrusion can be performed in combination with layer multiplication by a static mixer. In this way a multitude of layers is formed in the extrusion melt steam, which is then extruded through a die to form a sheet of adjustable thickness. The resulting barrier comprises alternating continuous layers of organic and inorganic materials. The number of layers depends on the application, and in principle a single layer of glass gives enough barrier effect, but only as long as there are no defects in the layer. Preferably, the barrier is built up of a few layers up to several thousands of layers, i.e. a multilayer barrier. With respect to layer multiplication can this be done in an exponential way, but also by multiplication in a feed block. In this case the number of layers is typically below 20, whereas with the exponential multiplication several thousands of layers can be obtained.

Figure 1A:
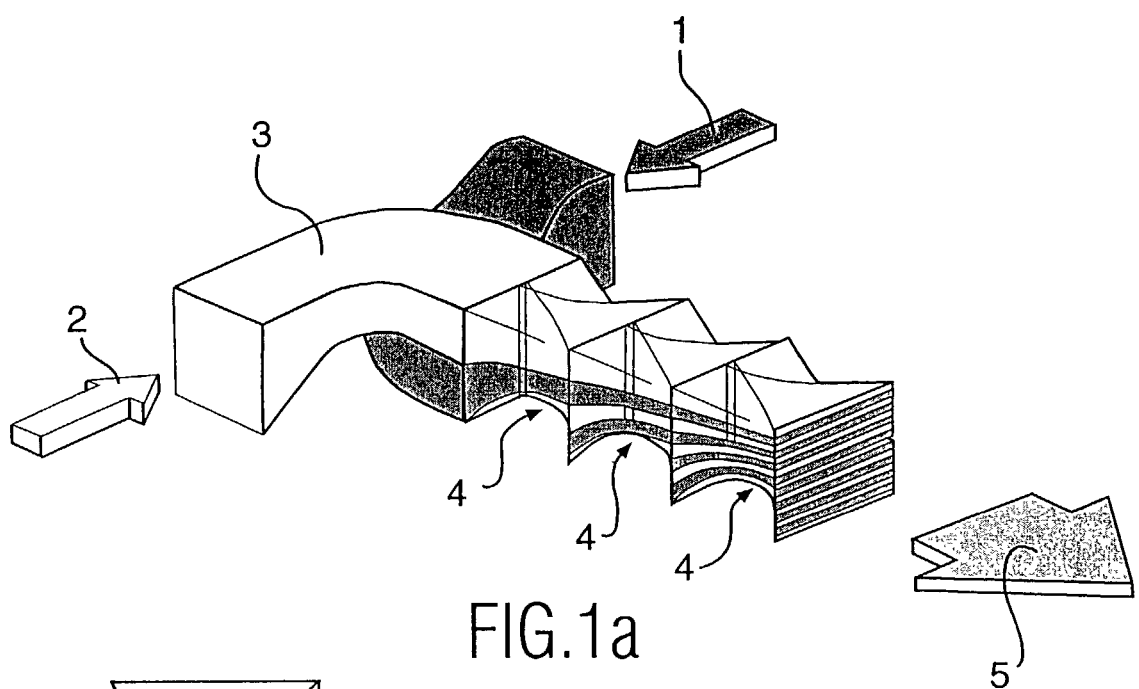
FIG. 1a shows a schematic representation of a layer multiplication device in a co-extrusion channel.
Figure 1B:
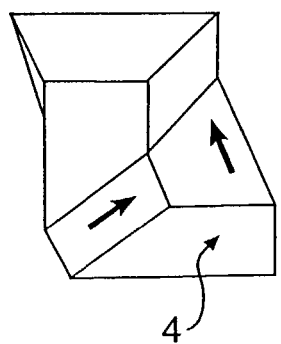
FIG. 1b shows a multiplication element.

FIG. 1A is a schematic representation of layer multiplication in a co-extrusion channel. Melts of an inorganic material 1 and of an organic material 2 is arranged to pass through a layer multiplication device 3. The layer multiplication device 3 is built up by multiplication elements 4 in the co-extrusion channel. In FIG. 1B a multiplication element 4 is schematically shown. The number of layers of the final barrier 5 is a continuous sheet and is determined by the number of the multiplication elements 4 in the co-extrusion channel and can be as high as several thousands. Moreover, the number of multiplication elements 4, and thus the number of layers, does not affect the processing conditions.

The layer thickness is theoretically unlimited and the thickness less than 50 nm has been demonstrated. The practical limit comes from the flow behaviour of the materials and the interfacial tension, and can be adjusted by the material fluxes at the entrance of the layer multiplication device 3. The materials can be supplied by moving pistons in heated cylinders or other plasticising units as known from polymer processing technology. Similar equipment is well known for a person skilled in the art from literature as it is used for extruding organic multilayer materials. The same principle is used for an injection moulding process instead of extrusion if a complex shape is required.

In order to have the multiplication device 3 work properly, the viscosities of the organic and inorganic melts 1, 2 should be adjusted as close as possible to equal values at a desired working temperature and deformation rate. In practice, this will affect the quality of the layer build up. If this is not so critical, this requirement can be relaxed.

For a match of the viscosity of the organic and inorganic materials, the inorganic material will be chosen with a glass-transition temperature ($T_g$) preferably below 300° C., more preferably in the interval 150–300° C., and the organic material will preferably have a $T_g$-value close enough to the $T_g$-value of the inorganic material. The fragility of the organic material should be small, relatively to that of the inorganic material. Fragility is the relative change of the viscosity with temperature normalised by $T_g$. Increasing fragility means an increasing temperature sensitivity of the viscosity in the melt state. The combination of $T_g$ and fragility determines the viscosity at a certain temperature. Practically, adjusting the $T_g$ is the easier way to tune the viscosity of the melt.

Both the inorganic material and the organic material are preferably solid at ordinary temperatures. The inorganic material is an inorganic glass, preferably a phosphate glass with a low enough viscosity, and the organic material is preferably a polymer. For a good transparency not only the individual materials should have a high transmittance of light, also the refractive indices should be matched reasonably to reduce reflections at the interface between the organic and inorganic materials. On the other hand, in cases where transparency is not required, it is possible to use blends of polymer with fillers as a way to improve the viscosity matching and the mechanical properties of the final barrier. Blends of polymer with low melting glasses could be combined as a replacement for all glass or all polymer layers. The polymer may comprise additives, which improve the mechanical properties, adhesion to the glass and other desired barrier properties.

By using a polymer, which is glassy at the application temperature, a rigid composite is formed which will show flexibility only at thin thickness, very much like glass sheet itself. The adhesion between the organic and inorganic material should be good to avoid delamination of the barrier after processing. The impact resistance, however, will be much higher than for a glass sheet (like safety glass) due to the continuous polymer layers in between the continuous inorganic glass layers. Since the barrier is still a thermoplastic material, thermoforming or other reshaping processes can be used for adjusting the shape for a desired application. The problem of crazing due to cutting is reduced as the continuous organic layers hamper the propagation of the crazes. Excellent barrier properties, which are maintained under mechanical deformation, are achieved through the multitude of layers so that defects or crazes which can occur in the brittle inorganic layers upon deformation do not lead to short diffusion paths as in the case in barrier films which comprise a barrier coating at the surface. For increased flexibility also rubbery polymeric materials can be used, although in practice it will be more difficult to match the melt viscosities for such a combination.

The barrier may also comprise a plastic cover layer on one or both sides for protection and as an appropriate interface to other components, which might be attached to the barrier in various applications.

Figure 2:
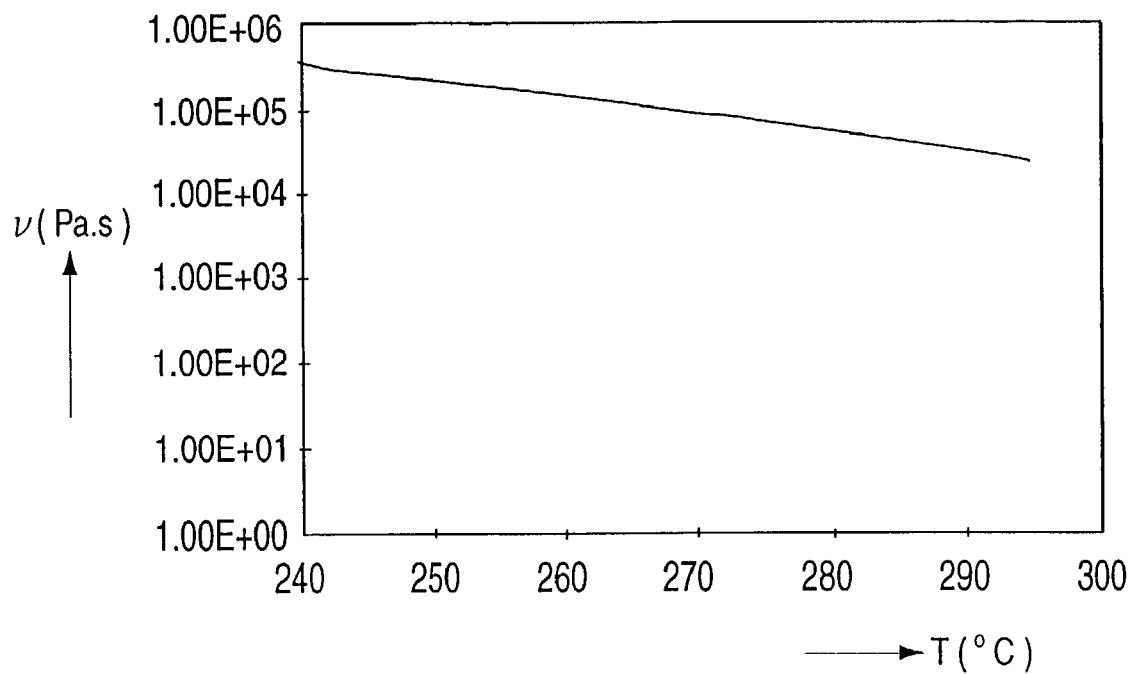
FIG. 2 is a graph showing the viscosity ν [Pa·s] of Ultem 1020 as a function of temperature T [° C.] at the shear rate $\gamma=10\ s^{-1}$.
Figure 3:
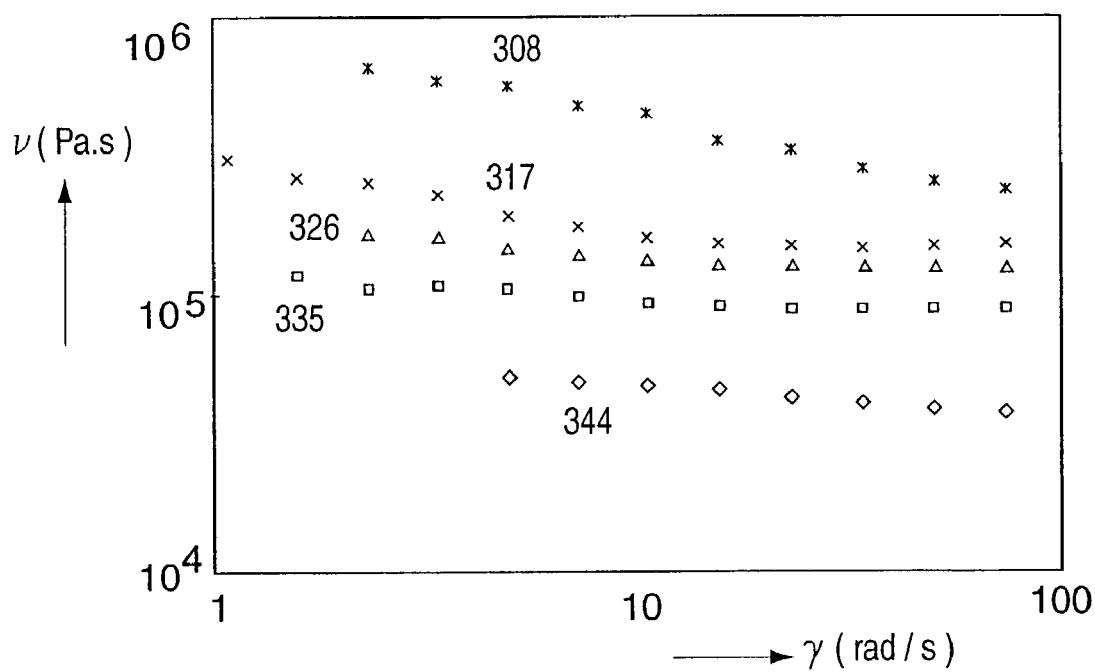
FIG. 3 is graph showing the viscosity ν [Pa·s] of a phosphate glass as a function of shear rate γ [rad/s] at inserted temperatures (308, 317, 326, 335 and 344° C.).

An embodiment of this invention will hereinafter be described. A barrier was extruded with a ram system connected to a multiplication channel containing 8 multiplication elements to produce a 256-layered barrier composite of approximately 0.2 mm thickness. The polymer used was Ultem 1020 of GE Plastics, a polyetherimide with a $T_g$ value of 200° C. The glass was synthesised following the recipe of Ray et al. (Ray, N H, Plaisted, R J, Robinson, W D, Glass Techn 17 (1976), 66–71): 70 $P_2O_5$, 5 $B_2O_3$, 10 $Li_2O$, 10 BaO and 5 MgO. The $T_g$ value was 200° C., as derived from DSC. The viscosities of the polymer and the glass melts are shown in FIGS. 2 and 3, respectively. As can be seen the viscosity of the inorganic glass melt is significantly higher than that of the polymer.

Figure 4:
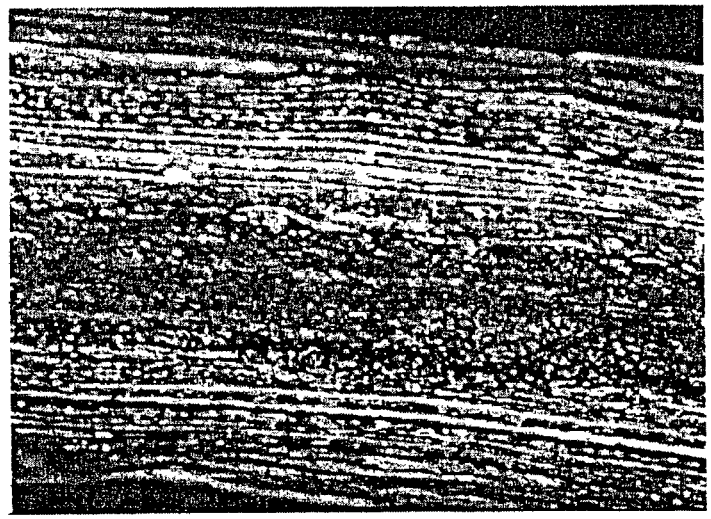
FIG. 4 is a photograph of a cross-section of an extruded barrier composite of the present invention (magnification 65×).

The co-extrusion with layer multiplication was carried out at 320° C. and resulted in a multilayer barrier, which was translucent, but not clear. However, a fully transparent barrier can be achieved by adjusting the refractive indices of the two materials to close enough values. The layer build up in the barrier is shown in FIG. 4. This picture is taken from a cross-section of the barrier under a microscope (magnification 65×). As can be seen the regular layer structure is preserved over a major part of the cross-section. However, in the core of the barrier layer break-up has occurred.

The adhesion of the organic and inorganic material was reasonable, but delamination was observed after multiple bending. The phosphate glass used is hygroscopic. This leads to a local dissolution of the glass over time when stored in a humid environment. However, this can be improved by using a different glass composition with a better stability, at the cost of a slightly higher $T_g$ value. This will increase the viscosity mismatch, but also the fragility of the glass can still be increased, as well as the molecular weight of the polymer in order to match the viscosities.

While a preferred embodiment of the invention has been illustrated and described, it shall be understood that the invention is not limited to this embodiment. Numerous modifications, changes and variations will be obvious for those skilled in the art, without departing from the scope of the invention as described by the appended claims. The barrier is primarily intended to be used in polymer LED, OLED's, CRT's and LCD's, but it could be used anywhere where excellent barrier properties are needed; FDS, TV, computers, light applications, such as light sources, etc. Moreover, said barrier may contain a colouring substance in order to gradually decrease the transparency of the barrier, or the inorganic and/or the organic materials may be coloured by themselves. Further, it may also be possible to manufacture the barrier using a wide range of inorganic and organic materials, which give different properties to the final barrier, as long as the inventive co-extrusion is possible. Furthermore, it may be possible to build up a barrier with more than one type of polymer and more than one type of glass, which can be made with this co-extrusion technology in a straightforward way. Also, the barrier may be made up with several polymers and glasses in various layers in order to build up a barrier having different properties in different layers.

The invention claimed is:

1. Method of manufacture of a barrier, especially for electronic display devices, comprising the step of co-extruding a melt of at least one inorganic material with a melt of at least one organic material, wherein the at least one inorganic material and the at least one organic material are co-extruded as a continuous sheet.

2. Method according to claim 1, comprising the step of co-extruding the melt of the at least one inorganic material and the melt of the at least one organic material through a co-extrusion channel comprising at least one multiplication element.

3. Method according to claim 1, wherein the continuous sheet comprises at least 10 alternating layers of the inorganic and the organic materials.

4. Method according to claim 3, wherein the inorganic glass is a phosphate glass.

5. Method according to claim 1, wherein the inorganic material is an inorganic glass.

6. Method according to claim 5, wherein the inorganic glass has a glass-transition temperature preferably below 300° C.

7. Method according to claim 1, wherein the organic material is a polymer.

8. Method according to claim 7, wherein the organic polymer material has a glass-transition temperature.

9. Method according to claim 8, wherein the glass-transition temperature is preferably below 300° C.

10. Method according to claim 1, comprising the step of adjusting the viscosities of the organic and inorganic melts as close as possible to equal values at a certain temperature and deformation rate.

11. Method according to claim 1, comprising the step of closely enough matching the refractive indices for the inorganic material and the organic material to reduce reflections at the interfaces.

12. Method according to claim 1, comprising the step of applying a plastic cover layer on at least one side of the continuous sheet.

* * * * *